United States Patent [19]
Bobroff et al.

[11] Patent Number: 5,298,351
[45] Date of Patent: Mar. 29, 1994

[54] ABLATION MASK AND USE THEREOF

[75] Inventors: Norman Bobroff, Katonah; Alan E. Rosenbluth, Yorktown Heights, both of N.Y.

[73] Assignee: International Business Machines Corporation, Armonk, N.Y.

[21] Appl. No.: 996,877

[22] Filed: Dec. 28, 1992

Related U.S. Application Data

[63] Continuation of Ser. No. 543,243, Jun. 25, 1990, abandoned.

[51] Int. Cl.$^5$ ................................................ G03F 9/00
[52] U.S. Cl. ........................................ 430/5; 430/323; 430/324; 430/945; 378/35; 156/643
[58] Field of Search .............. 430/5, 323, 324, 945; 378/35; 156/643

[56] References Cited

U.S. PATENT DOCUMENTS

| | | |
|---|---|---|
| 4,340,654 | 1/1970 | Campi . |
| 4,414,059 | 11/1983 | Blum et al. ........................ 430/324 |
| 4,456,371 | 6/1984 | Lin . |
| 4,522,862 | 6/1985 | Bayer et al. ............................ 430/7 |
| 4,618,561 | 10/1986 | Munakata et al. . |
| 4,764,441 | 8/1988 | Ohta et al. ............................ 430/5 |
| 4,822,144 | 4/1989 | Vriens .................................. 350/345 |
| 4,923,772 | 5/1990 | Kirch et al. ............................ 430/5 |
| 4,975,355 | 12/1990 | Suzuki ................................ 430/945 |

FOREIGN PATENT DOCUMENTS

| | | | |
|---|---|---|---|
| 0279670 | 8/1988 | European Pat. Off. | ............. 378/35 |
| 54-0152882 | 12/1979 | Japan . | |

OTHER PUBLICATIONS

Moreau, W. M. and Warnecke, A. J., "Dielectric Photomasks", IBM Technical Disclosure Bulletin, vol. 13, No. 1, Jun. 1970.
Martin, P. J. et al, "Ion-Assisted Dielectric and Optical Coatings", Handbook of Ion Beam Processing Technology, Noyes Publications, pp. 373-393.
Elliott, D. J., "Integrated Circuit Mask Technology", pp. 87-92, McGraw-Hill Book Co.
Tannas, L. E., "Flat-Panel Displays and CRTs", pp. 415-445, Van Nostrand Reinhold Company.

Primary Examiner—Charles L. Bowers, Jr.
Assistant Examiner—Thomas R. Neville
Attorney, Agent, or Firm—Pollock, Vande Sande & Priddy

[57] ABSTRACT

An ablation mask that includes a transparent substrate having a patterned layer located between two dielectric transparent material coatings thereon is provided. Also, the ablation mask is useful in dry etching processes to provide patterned layers, and other laser processing applications that require high fluence such as photodeposition, thin film transfer and thin film release.

11 Claims, 5 Drawing Sheets

ABLATION MASK AND USE THEREOF

This application is a continuation of Ser. No. 07/543,243, filed on Jun. 25, 1990, now abandoned.

TECHNICAL FIELD

The present invention is concerned with new ablation masks that are especially resistant to damage and are suitable in fabricating electronic devices. Ablation masks of the present invention are relatively easy to inspect and repair if damaged. The present invention is also concerned with the use of the ablation masks in dry etching processes.

BACKGROUND ART

In the fabrication of electronic devices, one of the most critical and crucial steps is the lithographic processing for providing desired patterns such as circuit patterns and vias to connect different layers to each other.

Traditionally, wet etching processes have been employed to define the desired pattern. For instance, a resist material is typically exposed to actinic radiation such as ultraviolet light, electrons beams or x-rays in the desired pattern. The exposed regions in the case of a positive resist and the unexposed regions in the case of a negative resist are then removed or developed by dissolving in a suitable solution. After the development, the desired pattern remains in the resist layer. Next, an additional processing step such as etching is used to transfer the resist pattern into one of the functional layers of the electronic device. The resist layer is then removed.

However, in an attempt to eliminate the development step and/or pattern transfer step, suggestions have been made to employ dry etching techniques. One such technique employs ablative decomposition using high powered pulsed sources of irradiation as disclosed in U.S. Pat. No. 4,414,059, disclosure of which is incoporated herein by reference. In that process, a large number of photons of particular wavelength are directed to the patternable material in a short time. This results in breaking the polymer chain of the patternable material into fragments which ablate and are blown off as volatile by-products. Such processes typically employ wavelengths of between about 190 nanometers and about 450 nanometers. Ablative decomposition can also be used to directly etch a pattern into a functional layer of an electronic device, eliminating the need for the photoresist step.

The masks employed for such purposes must withstand peak laser fluxes of about 500 mj/cm$^2$-pulse without damage. Presently, one such mask employed is described in U.S. patent applications Ser. Nos. 924,480 and 341,273 to Lankard, et al. Such masks are fabricated by etching the desired pattern into a reflecting thin film multilayer containing about 10 to about 30 layers. Such films are adequate to withstand the required laser irradiation. However, such are relatively difficult to etch and the yields are relatively low. Accordingly, it would be desirable to provide ablation masks whereby the technique is relatively easy to perform and the yields are relatively high.

SUMMARY OF INVENTION

The present invention provides ablation masks that are relatively easy to fabricate and are relatively damage resistant. Moreover, the masks of the present invention are easy to inspect for potential defects and relatively easy to repair when necessary. In addition, the ablation masks of the present invention exhibit the necessary resistance to ablative conditions to be effective in dry etching processing.

In particular, the present invention is concerned with an ablation mask that includes a transparent substrate. On a major surface of the substrate is located a first dielectric transparent material coating and then in turn a patterned layer is located on the first dielectric transparent material coating. On the patterned layer is located a second dielectric transparent material coating.

In the case where the patterned layer is obtained from an opaque material, and contains opaque portions where the material remains and cleared portions where the material is removed, those opaque portions in combination with the first dielectric transparent material coating result in reflection of most of the incident laser light thereby preventing such from exposing those areas of material that underlie the opaque portions. Most of the laser light can be reflected by the first dielectric transparent material, thereby reducing the light absorbed by the opaque layer to a level below the threshold of damage. On the other hand, in those areas where the material has been removed from the patterned layer, the combination of the first and second dielectric transparent material coatings will result in transmission of most of the light through the mask structure where it will then in turn be employed for ablation or some other processing.

Alternatively, in the case where the patterned layer is made from a transparent material, two embodiments are possible. In the preferred embodiment, the portions of the patterned layer that remain with full thickness will act in combination with the first and second transparent unpatterned coatings to transmit light through the mask, while those regions of the patterned coating where the thickness has been reduced will act in combination with the two coatings to reflect the light. In a second embodiment, the initial thickness and etch depth in the patterned layer are instead chosen in such a way as to exchange the regions that are reflecting and transmitting in the first embodiment.

In addition, the present invention is concerned with laser processing that requires high fluence such as an etching process that comprises providing a patternable material on a substrate and then selectively exposing that material through the above-defined mask to actinic light. In the case of positive-acting resist material, the areas exposed to the actinic light will be removed and in the case of negative-acting resist materials, the material not exposed to the actinic light will be removed. The ablation mask may also be used for other laser processing applications that require high fluence such as photodeposition, thin film transfer and thin film release.

For example, the actinic light may be used for photoablative etching or other radiation-induced direct transfer of the pattern into a functional layer of an electronic device, thereby eliminating the photoresist step.

BEST AND VARIOUS MODES FOR CARRYING OUT INVENTION

Figure 1A:
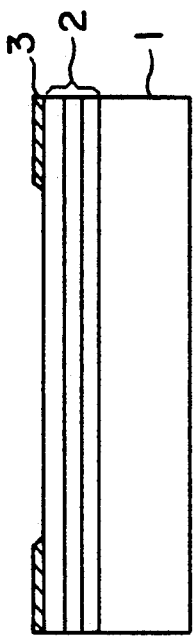
FIGS. 1A to 1D schematically represent the mask of the present invention in various stages of fabrication.

The present invention is concerned with a patterned mask and especially a mask that can be used for ablation processing. In order to facilitate understanding of the present invention, reference is made to the Figures and particularly FIGS. 1A to 1D. In FIG. 1A, numeral 1 represents the transparent substrate. Suitable substrates include fused silica, glass, sapphire and fluorite. Typically, the substrate is about 0.01 to about 0.25 and most commonly about 0.09 to about 0.125 inches thick.

Located on top of a major surface of the substrate is a first dielectric transparent material coating (2). This coating usually employs about 6 to about 40 layers of the dielectric transparent material with each layer being about $\lambda/8$ to about $3\lambda/4$ 1 and preferably about $\lambda/4$.

Examples of some suitable dielectric materials for this purpose include silicon dioxide, hafnium dioxide, scandium oxide, aluminum oxide, tantalum pentoxide, thoria, and magnesium fluoride. The dielectric material can be coated onto the transparent substrate by any suitable conventional means such as sputtering and evaporation techniques and preferably ion-assisted deposition. Typical procedures employed are described in section 19.4 of a review article by P. Martin and R. Netterfield, "Ion-Assisted Dielectric and Optical Coatings," in *Handbook of Ion-Beam Processing Technology*, edited by J. J. Cuomo et al., disclosure of which is incorporated herein by reference.

On the first dielectric transparent material coating is provided a patterned layer (3). The patterned layer can be an opaque film that has been patterned using conventional photoresist and etch processing techniques. The opaque patterned layer (3) is usually about 500 angstroms to about 1 micron thick and preferably about 8000Å to about 1 micron. Preferred opaque materials include chromium and aluminum and most preferably chromium. A typical etchant used to pattern chromium is cerium aluminum nitrate in nitric acid. The chromium can be deposited by any conventional technique such as sputtering or evaporation. A typical procedure employed is sputtering. Chromium deposition techniques are described on pages 88-91 of "Integrated Circuit Mask Technology," by D. Elliot, disclosure of which is incorporated herein by reference.

In place of the preferred aspect of the present invention of an opaque patterned material, the patterned layer can be a transparent film or an addressable film whereby the transparency of the film is controlled by external means. In the event, the patterned layer is a transparent film, such would usually have a thickness of less than the wavelength of light to be employed in the process to which the mask is to be used and preferably a thickness of about either $\lambda/4$, $\lambda/2$ or $3\lambda/4$. Etched regions of the patterned layer may not be fully removed; instead, the thickness may only be reduced. The thicknesses given in $\lambda$ units for transparent optical thin film layers refer to the physical thickness of the layer multiplied by the refractive index. Suitable transparent materials include silicon dioxide, hafnium dioxide, scandium oxide, aluminum oxide, tantalum pentoxide, thoria and magnesium fluoride. Addressable film are materials that include conductive transparent lines therein that when a voltage is applied thereto will become opaque or will result in a difference in the index of refraction of those patterned portions of the layer. Suitable materials forming such conductive lines are indium/tin oxide. The addressable films may be electrochromic as described in section 11.6 of "Flat Panel Displays and CRTs," by L. Taunas, disclosure of which is incorporated herein by reference.

Figure 1C:
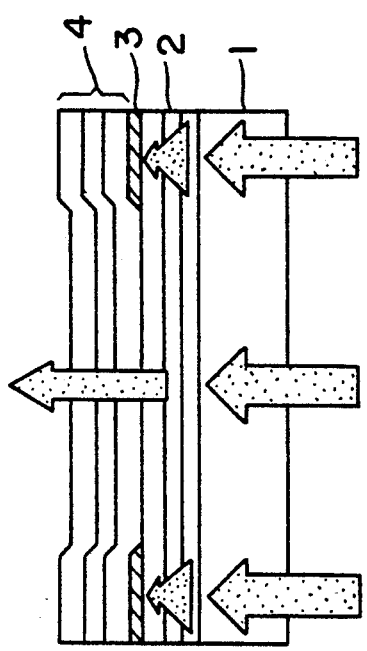
Figure 1B:

Atop the patterned layer is a second dielectric transparent material coating (4) (see FIG. 1C). The second dielectric coating typically contains about 9 to about 40 layers of dielectric material, each layer usually being less than the wavelength of light to which the mask is to be employed and typically about $\lambda/8$ to about $3\lambda/4$ and most commonly about $\lambda/4$ in thickness. Suitable materials are the same as those disclosed hereinabove for the first dielectric transparent materials. Such can be applied to the structure by conventional methods such as sputtering and evaporation and preferably ion-assisted deposition as disclosed above.

Figure 1D:
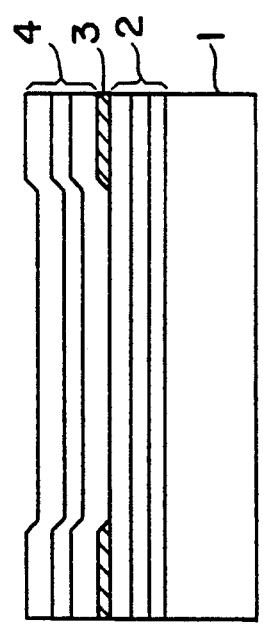

The combination of the first dielectric layer and the opaque portions of the patterned layer as illustrated in FIG. 1D will reflect most of the incident laser light leaving very little light that will have to be absorbed by the opaque portions. On the other hand, the combination of the first and second dielectric layers will result in transmission of most of the light through the mask structure whereby it can then in turn be used for the desired processing. This effect is achieved because the multilayer coatings superimpose amplitudes of light rather than intensities.

In the case of a patterned layer being transparent material, the separation provided by the transparent portion between the first and second dielectric transparent materials will result in reflection of incident light that is in phase thereby permitting very little transmittance. On the other hand, in those locations void of the transparent material whereby the first and second dielectric materials are continuous in contact with each other the reflection will be out of phase resulting in substantially complete transmission of the incident light.

Alternatively, the separation provided by the transparent portion may be chosen to result in exact dephasing of the reflection from the first and second unpatterned dielectric coatings, thereby resonantly enhancing transmission. On the other hand, in those regions where the thickness of the patterned layer has been reduced, usually to about half the initial thickness, the first and second materials are brought out of the transmittance resonance, and the reflectivity is very high.

Table 1 below illustrates a structure pursuant to the present invention specifically designed for wavelength of 308 nanometers with all of the dielectric layers being about $\lambda/4$ in thickness. Layers numbered 1 to 8 represent the first dielectric transparent material coating, layer 9 represents the patterned opaque layer, and layers 2' to 11' represent the second dielectric transparent material coatings.

TABLE 1

| Layer number | Material Coating #1 | Coating #2 | Thickness | Index |
|---|---|---|---|---|
| | (Bulk SiO$_2$) | | | 1.49 |
| 1 | HfO$_2$ | | 365Å | 2.11 |
| 2 | SiO$_2$ | | 525Å | 1.46 |
| 3 | HfO$_2$ | | 365Å | 2.11 |

TABLE 1-continued

| Layer number | Material Coating #1 | Coating #2 | Thickness | Index |
|---|---|---|---|---|
| 4 | SiO$_2$ | | 525Å | 1.46 |
| 5 | HfO$_2$ | | 365Å | 2.11 |
| 6 | SiO$_2$ | | 525Å | 1.46 |
| 7 | HfO$_2$ | | 365Å | 2.11 |
| 8 | SiO$_2$ | | 525Å | 1.46 |
| (9)1 | (Cr) | SiO$_2$ | (~1000Å) 525Å | (1.54 + 2.34i) 1.46 |
| 2' | | HfO$_2$ | 365Å | 2.11 |
| 3' | | SiO$_2$ | 525Å | 1.46 |
| 4' | | HfO$_2$ | 365Å | 2.11 |
| 5' | | SiO$_2$ | 525Å | 1.46 |
| 6' | | HfO$_2$ | 365Å | 2.11 |
| 7' | | SiO$_2$ | 525Å | 1.46 |
| 8' | | HfO$_2$ | 365Å | 2.11 |
| 9' | | Al$_2$O$_3$ | 425Å | 1.81 |
| 10' | | HfO$_2$ | 365Å | 2.11 |
| 11' | | MgF$_2$ | 550Å | 1.40 |
| | | (Air) | | |

Design wavelength: 308 nm.

Transmission into chrome: 5.5%
Standard chrome mask: 65%
Angular field (at T = 50%): 9°

It is helpful in understanding the manner in which these coatings can operate to consider the analogy with a Fabry-Perot reflection or transmission etalon. In the non-transmitting mask regions, the final dielectric film of the first dielectric transmission material coating can be regarded as an etalon spacer while two end mirrors are formed by the opaque portions and the initial layers of the first dielectric transparent material coating. Reflection is maximized and transmission minimized by the particular spacing between the first layers and the opaque portions. Furthermore, the transmitting portions of the materials can also be thought of as an etalon with the last dielectric layer of the first dielectric transparent material coating and the first layer of the second dielectric transparent material coating forming a joint spacer layer. This thickness can be used to resonantly enhance transmittance.

Accordingly, in the mask structure referred to in Table 1, the first λ/4 silicon dioxide coating present in the second dielectric transparent material coating or zone together with the last silicon dioxide layer in the first dielectric transparent material coating forms a spacer of phase thickness 180° for the second etalon. The next several coatings in the second dielectric transparent material forms the second end mirror which is followed by a three layer anti-reflection coating to match the system to air.

The mask structure shown in Table 1 below reduces the transmission into the opaque chrome areas to about 5.5% as compared to about 65% for an ordinary chrome mask. The radiation load on the chrome is therefore reduced by an order of magnitude.

It has been noted that the transitional absorption at feature edges will be decreased or increased depending upon whether the opaque metal film lies nearer the node or antinode of the adjacent standing-wave, which exists between the first and second dielectric transparent materials in neighboring regions where the opaque metal has been removed. The design illustrated in Table 1 below places the metal film alongside the antinode of the standing-wave in adjacent open areas.

A design along the lines of those in Table 2 listed below results in the metal film being adjacent to the standing-wave node.

TABLE 2

| Layer number | Material Coating #1 | Coating #2 | Thickness | Index |
|---|---|---|---|---|
| | (Bulk SiO$_2$) | | | 1.49 |
| 1 | HfO$_2$ | | 365Å | 2.11 |
| 2 | SiO$_2$ | | 525Å | 1.46 |
| 3 | HfO$_2$ | | 365Å | 2.11 |
| 4 | SiO$_2$ | | 525Å | 1.46 |
| 5 | HfO$_2$ | | 365Å | 2.11 |
| 6 | SiO$_2$ | | 525Å | 1.46 |
| 7 | HfO$_2$ | | 365Å | 2.11 |
| 8 | SiO$_2$ | | 525Å | 1.46 |
| 9 | HfO$_2$ | | 365Å | 2.11 |
| (10)1 | (Cr) | HfO$_2$ | (~1000Å) 365Å | (1.54 + 2.34i) 2.11 |
| 2' | | SiO$_2$ | 525Å | 1.46 |
| 3' | | HfO$_2$ | 365Å | 2.11 |
| 4' | | SiO$_2$ | 525Å | 1.46 |
| 5' | | HfO$_2$ | 365Å | 2.11 |
| 6' | | SiO$_2$ | 525Å | 1.46 |
| 7' | | HfO$_2$ | 365Å | 2.11 |
| 8' | | SiO$_2$ | 525Å | 1.46 |
| 9' | | HfO$_2$ | 365Å | 2.11 |
| 10' | | Al$_2$O$_3$ | 425Å | 1.81 |
| 11' | | HfO$_2$ | 365Å | 2.11 |
| 11' | | MgF$_2$ | 550Å | 1.40 |
| | | (Air) | | |

Design wavelength: 308 nm.

Transmission into chrome: 10%
Standard chrome mask: 65%
Angular field (at T = 50%): 8°

The mask structures of the present invention provide an advantage that during mask inspection very high contrast exists at all visible inspection wavelengths in contrast to present dielectric masks thereby rendering the inspection much easier and more effective in carrying out. Moreover, since the contrast in these masks is provided by the opaque metal layer such as the chrome and/or aluminum, the mask can be readily repaired using standard techniques. Moreover, once the second dielectric transparent material coating is deposited, the patterned layer is protected by an abrasion-resistant dielectric overcoat.

Figure 2:
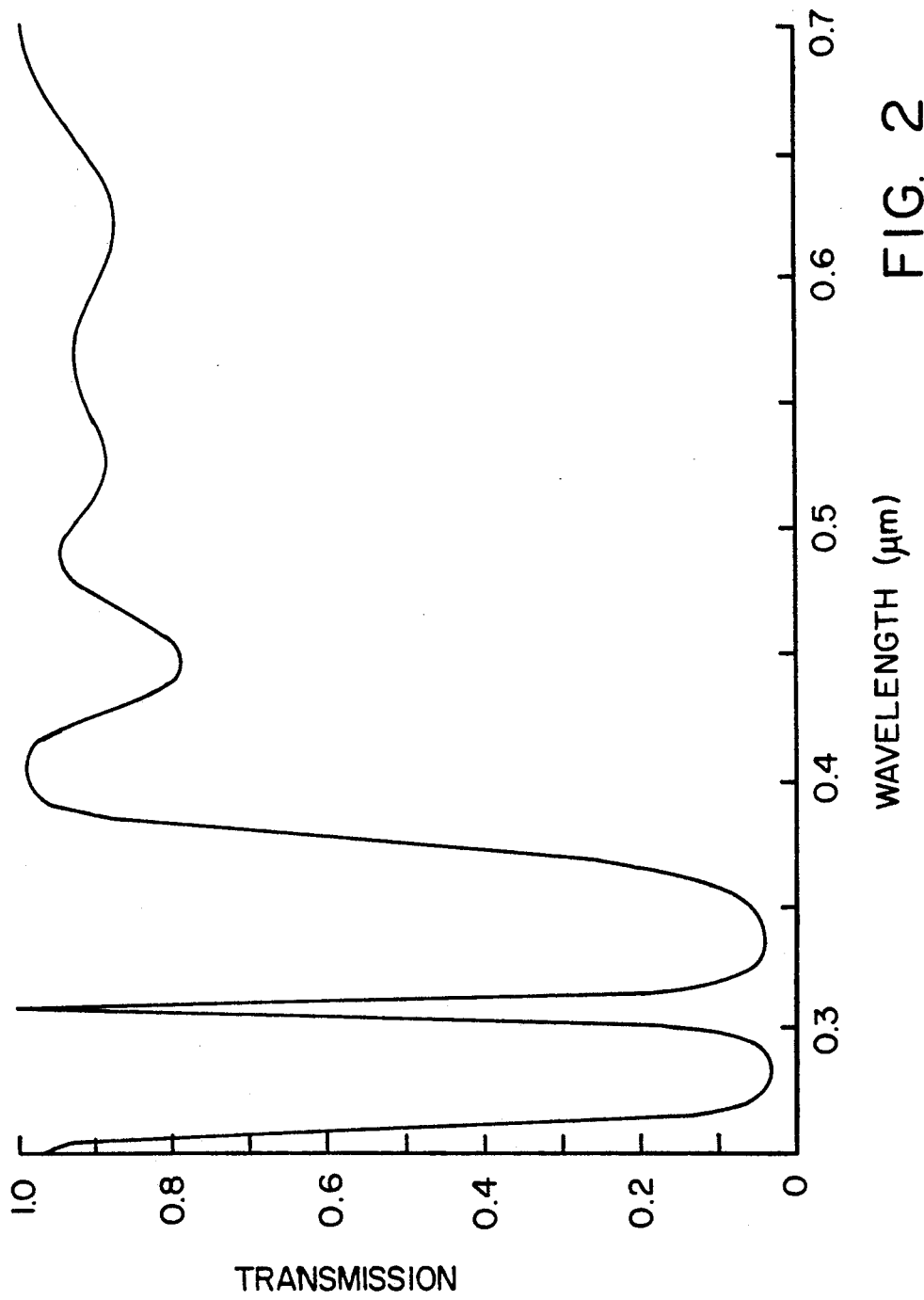
FIG. 2 illustrates the transmission characteristics achieved by the combination of the first and second dielectric transparent coatings.
Figure 3:
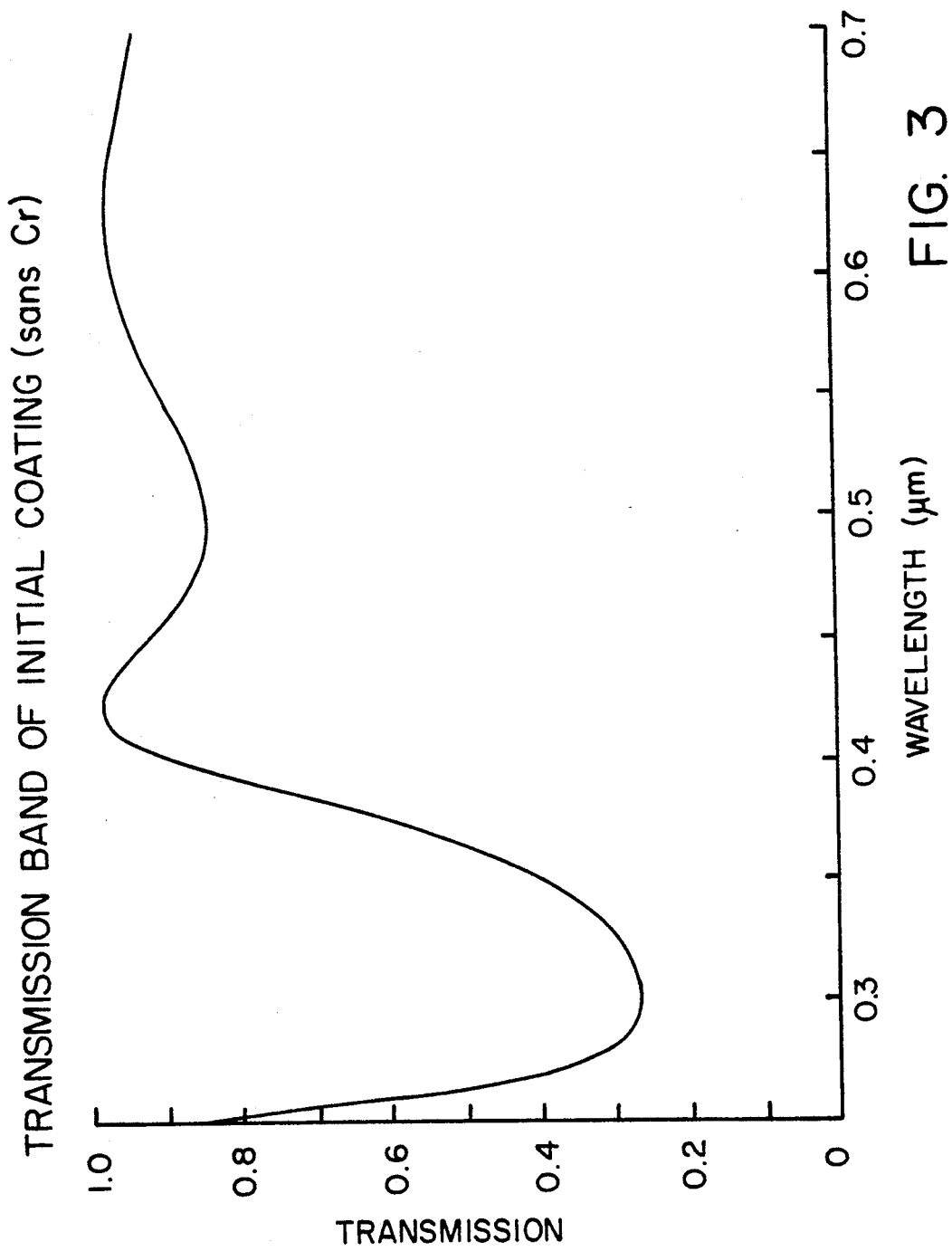
FIG. 3 illustrates the transmission characteristics of only the first dielectric transparent coating.

In FIG. 2, the transmission versus wavelength is plotted showing that the open regions of the mask exhibit high transmittance throughout the visible spectrum. In addition, FIG. 3 shows that the initial coating in the design of Table 1 is highly transmissive throughout the visible spectrum thereby allowing inspection and repair after the chrome patterning step. The transmission spike in the plot of FIG. 2 is a result of the highly resonant structure of the combination of the first and second dielectric transparent material coatings.

Figure 4:
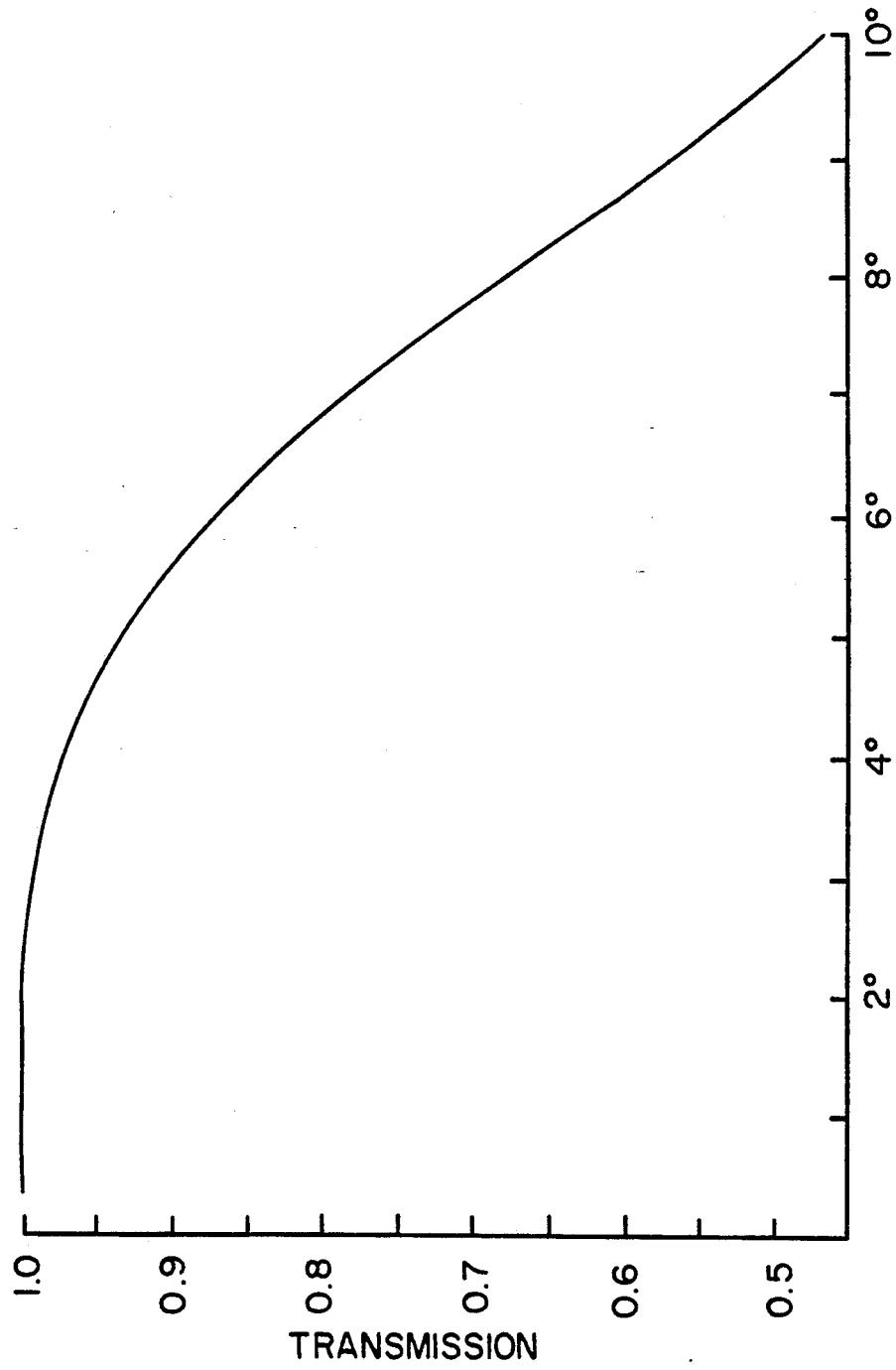
FIG. 4 illustrates transmission characteristics of one of the embodiments of the present invention.

FIG. 4 represents the transmission band for the device constructed in accordance with the layers specified in Table 1.

Figure 5:
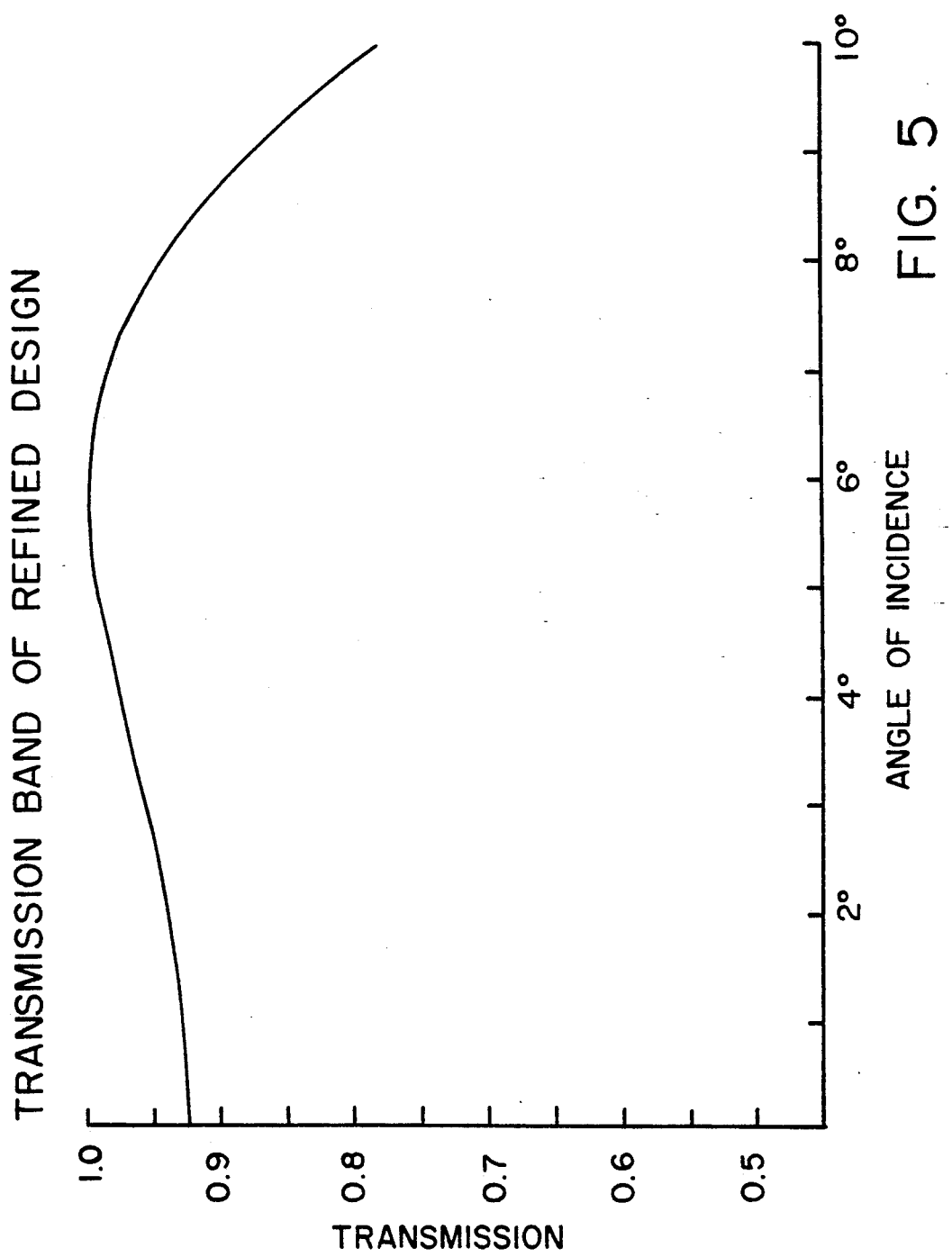
FIG. 5 illustrates the transmission characteristics of another embodiment of the present invention.

FIG. 5 illustrates the transmission band for a mask prepared pursuant to the configuration in Table 3 below. Table 3 illustrate a design with increased field angle transparent material coating, layer 9 represents the patterned opaque layer and layers 2'-9' represent the second dielectric transparent material coatings.

TABLE 3

| Layer number | Material Coating #1 | Coating #2 | Thickness | Index |
|---|---|---|---|---|
| | (Bulk SiO$_2$) | | | 1.49 |
| 1 | HfO$_2$ | | 397Å | 2.11 |
| 2 | SiO$_2$ | | 455Å | 1.46 |
| 3 | HfO$_2$ | | 358Å | 2.11 |
| 4 | SiO$_2$ | | 435Å | 1.46 |
| 5 | HfO$_2$ | | 355Å | 2.11 |

TABLE 3-continued

| Layer number | Material Coating #1 | Material Coating #2 | Thickness | Index |
|---|---|---|---|---|
| 6 | SiO$_2$ | | 464Å | 1.46 |
| 7 | HfO$_2$ | | 361Å | 2.11 |
| 8 | SiO$_2$ | | 484Å | 1.46 |
| (9)1 | (Cr) | SiO$_2$ | (~1000Å) 626Å | (1.54 + 2.34i) 1.46 |
| 2' | | HfO$_2$ | 373Å | 2.11 |
| 3' | | SiO$_2$ | 526Å | 1.46 |
| 4' | | HfO$_2$ | 368Å | 2.11 |
| 5' | | SiO$_2$ | 491Å | 1.46 |
| 6' | | HfO$_2$ | 366Å | 2.11 |
| 7' | | SiO$_2$ | 656Å | 1.46 |
| 8' | | HfO$_2$ | 400Å | 2.11 |
| 9' | | SiO$_2$ | 320Å | 1.81 |
| | | (Air) | | |

Design wavelength: 308 nm.

Transmission into chrome: 6%
Standard chrome mask: 65%
Angular field (at T = 50%): 12°

We claim:

1. A patterned mask comprising a transparent substrate; first unpatterned dielectric transparent material coating on a major surface of said substrate, said first coating being composed of multiple layers with each layer having a thickness of about λ/8 to about 3λ/4; patterned layer of a predetermined material located on said first dielectric transparent material coating, said patterned layer having regions where said predetermined material is present at a first thickness and regions where said predetermined material is omitted or present at a second thickness; and a second unpatterned dielectric transparent material coating on said patterned layer which is composed of multiple layers.

2. The mask of claim 1 wherein in regions where said patterned layer is omitted, said first and second dielectric transparent material coatings abut each other, causing the two coatings in series to be substantially transmissive at wavelength λ.

3. The mask of claim 2 wherein said predetermined material of said patterned layer is opaque.

4. The mask of claim 1 wherein at regions wherein said patterned layer is present at a second thickness, the first and second coatings are spaced from each other by a predetermined distance which causes said first and second coatings in series to be substantially transmissive at wavelength λ.

5. The mask of claim 4 wherein said predetermined material of said patterned layer is transmissive.

6. The mask of claim 1 wherein the thickness of each layer of the first dielectric and of the second dielectric is about λ/4.

7. The mask of claim 1 wherein said dielectric material is selected from the group of silicon dioxide, hafnium dioxide, scandium oxide, aluminum oxide, tantalum pentoxide, thoria and magnesium fluoride.

8. The mask of claim 1 wherein said patterned layer is about 500 angstroms to about 1 micron thick.

9. The mask of claim 1 wherein said patterned layer is chromium or aluminum.

10. The mask of claim 1 wherein said patterned layer is chromium.

11. The mask of claim 1 wherein said patterned layer is an addressable layer.

* * * * *